(12) United States Patent
Li et al.

(10) Patent No.: US 10,767,331 B2
(45) Date of Patent: Sep. 8, 2020

(54) RISER FATIGUE MONITORING

(71) Applicant: BP Exploration and Production, Inc., Houston, TX (US)

(72) Inventors: Songcheng Li, Houston, TX (US); Michael Campbell, Houston, TX (US); Michael Long Ge, Katy, TX (US)

(73) Assignee: BP Exploration and Production, Inc., Houston, TX (US)

( * ) Notice: Subject to any disclaimer, the term of this patent is extended or adjusted under 35 U.S.C. 154(b) by 369 days.

(21) Appl. No.: 14/579,645

(22) Filed: Dec. 22, 2014

(65) Prior Publication Data

US 2015/0176237 A1    Jun. 25, 2015

Related U.S. Application Data

(60) Provisional application No. 61/920,145, filed on Dec. 23, 2013.

(51) Int. Cl.
*E02B 17/00* (2006.01)
*E21B 17/01* (2006.01)
(Continued)

(52) U.S. Cl.
CPC ...... *E02B 17/0017* (2013.01); *E02B 17/0034* (2013.01); *E21B 17/01* (2013.01);
(Continued)

(58) Field of Classification Search
None
See application file for complete search history.

(56) References Cited

U.S. PATENT DOCUMENTS 3,313,345 A * 4/1967 Fischer ............... E21B 7/128
166/355
4,715,451 A   12/1987 Bseisu et al.
(Continued)

FOREIGN PATENT DOCUMENTS

| CN | 101334322 A | 12/2008 |
| GB | 1583552 | 6/1976 |
| JP | 9145530 A | 6/1997 |

OTHER PUBLICATIONS

Offshore Engineer, Aug. 2014, pp. 90-93 (Year: 2014).*
Bakker, "An Alternative Methodology for Riser Lifetime Prediction", Dec. 22, 2011, 118 pgs.

*Primary Examiner* — Matthew G Marini
(74) *Attorney, Agent, or Firm* — Conley Rose, P.C.

(57) ABSTRACT

A system and method is provided for determining curvature for subsea riser system, including but not limited to drilling risers, steel catenary risers, lazy-wave catenary risers and riser jumpers, comprising the steps of: periodically measuring acceleration in a first lateral direction at said vertical position to obtain a first acceleration timetrace processing said first acceleration timetrace to obtain a first acceleration spectra; applying a transfer function to said first acceleration spectra to obtain a first curvature spectra; and processing said first curvature spectra to obtain a first curvature timetrace. Preferably the transfer function is determined by a method comprising the step of modelling the riser as a Tensioned Timoshenko Beam.

The curvature may be used to determine stress and fatigue damage in a structure from motions measured at a single location or a combination of motions measured at a single location with or without tension measurement. The method can be used to determine curvature and hence stress and fatigue damage from any source of excitation, for example the excitation at the tension ring by the top tensioner system, and the vortex induced vibration locked in at any water depth.

12 Claims, 3 Drawing Sheets

(51) Int. Cl.
*G06F 30/20* (2020.01)
*E21B 47/00* (2012.01)

(52) U.S. Cl.
CPC .......... *E21B 47/0001* (2013.01); *G06F 30/20* (2020.01); *E02B 2017/0095* (2013.01)

(56) References Cited

U.S. PATENT DOCUMENTS

| | | | |
|---|---|---|---|
| 4,965,774 | A | 10/1990 | Ng et al. |
| 8,725,429 | B2 | 5/2014 | McNeill et al. |
| 2003/0230409 | A1 | 12/2003 | Guesnon et al. |
| 2006/0065401 | A1* | 3/2006 | Allen .................... E21B 19/004 |
| | | | 166/345 |
| 2011/0176125 | A1 | 7/2011 | Smith et al. |
| 2011/0178730 | A1 | 7/2011 | Mangal et al. |
| 2011/0204143 | A1 | 8/2011 | Mackenzie et al. |
| 2012/0303293 | A1 | 11/2012 | McNeill et al. |
| 2013/0060487 | A1* | 3/2013 | Papadimitriou ........ G10L 15/22 |
| | | | 702/34 |

* cited by examiner

RISER FATIGUE MONITORING

This application claims the benefit of U.S. Provisional Patent Application Ser. No. 61/920,145, filed on Dec. 23, 2013 and entitled "Riser Fatigue Monitoring", which is incorporated herein by reference in its entirety for all purposes.

BACKGROUND a. Field of the Invention

The present invention relates to field monitoring of riser systems used in the oil and gas industry. However, this method can be used for any type of similar structure such as cables, umbilicals, mooring lines and pipeline spans. In particular, this invention relates to the use of motions measured at a single location, in lieu of strain sensors, for curvature and fatigue damage monitoring under excitation from any source.

b. Description of the Related Art

Risers are used in the oil and gas industry as the pipe conduit between the ocean seabed and the surface. Risers and similar structures such as cables, umbilicals and mooring lines are exposed to the environment and are susceptible to excitation from various sources which can cause fatigue accumulation in the structures. Fatigue monitoring can be used to determine the riser fatigue accumulation, confirm riser integrity and assist in operational decisions.

Fatigue monitoring can be achieved through strain and curvature measurement, motion measurements, or a combination of these. The benefit of strain or curvature measurement is that it is a direct measurement. However, depending on the application, subsea strain measurement may not be feasible. In addition, subsea strain measurement may not have the required track record, reliability and cost effectiveness of motion measurement. Hence, it is preferable to have a means of determining curvature from motion measurements.

A number of methods currently exist to determine fatigue damage from motion measurements. Typically these take the form of reconstruction methods using mode shapes and/or mode superposition. As an example US Patent 2012/0303293 A1 presents a method based on the use of time synchronous measurements and mode superposition. Another approach is to use finite element analysis (FEA) to determine acceleration to stress transfer functions.

The objective of the present invention is to provide an improved monitoring means allowing continuous measurement of riser fatigue from accelerations without the necessity for strain or curvature measurement devices, time synchronous measurements, theoretical mode shapes and/or finite element analysis (FEA).

SUMMARY OF THE INVENTION

It is an object of the present invention to address the problems cited above, and provide a system and method for monitoring fatigue in risers owing to motion-induced stresses within the riser.

The invention provides a method for determining curvature at a vertical position in a subsea riser system comprising the steps of: periodically measuring acceleration in a first lateral direction at said vertical position to obtain a first acceleration timetrace processing said first acceleration time trace to obtain a first acceleration spectra; applying a transfer function to said first acceleration spectra to obtain a first curvature spectra; and processing said first curvature spectra to obtain a first curvature timetrace.

Preferably the transfer function is determined by a method comprising the step of modelling the riser as a Tensioned Timoshenko Beam.

The invention has motion modules comprising motion sensors at points along the riser length, each sensor includes at least one accelerometer, and preferably two or three accelerometers for measuring acceleration in up to three orthogonal directions, which measure acceleration owing to excitation from vessels, waves and currents. Mean tension and mean curvature are determined at the module location. The riser dynamic acceleration is then measured in three dimensions. A transfer function based on the mean tension and mean curvature may be used together with measured riser accelerations to determine instant riser curvature.

The transfer function is derived using an analytical method based on tensioned Timoshenko beam theory and wave propagation theory and thus no FEA is required.

The measured riser accelerations may be translated into stress time traces for fatigue assessment using the derived transfer function.

BRIEF DESCRIPTION OF THE DRAWINGS

The invention will now be further described, by way of example only, and with reference to the accompanying drawings in which.

DETAILED DESCRIPTION

Figure 1:
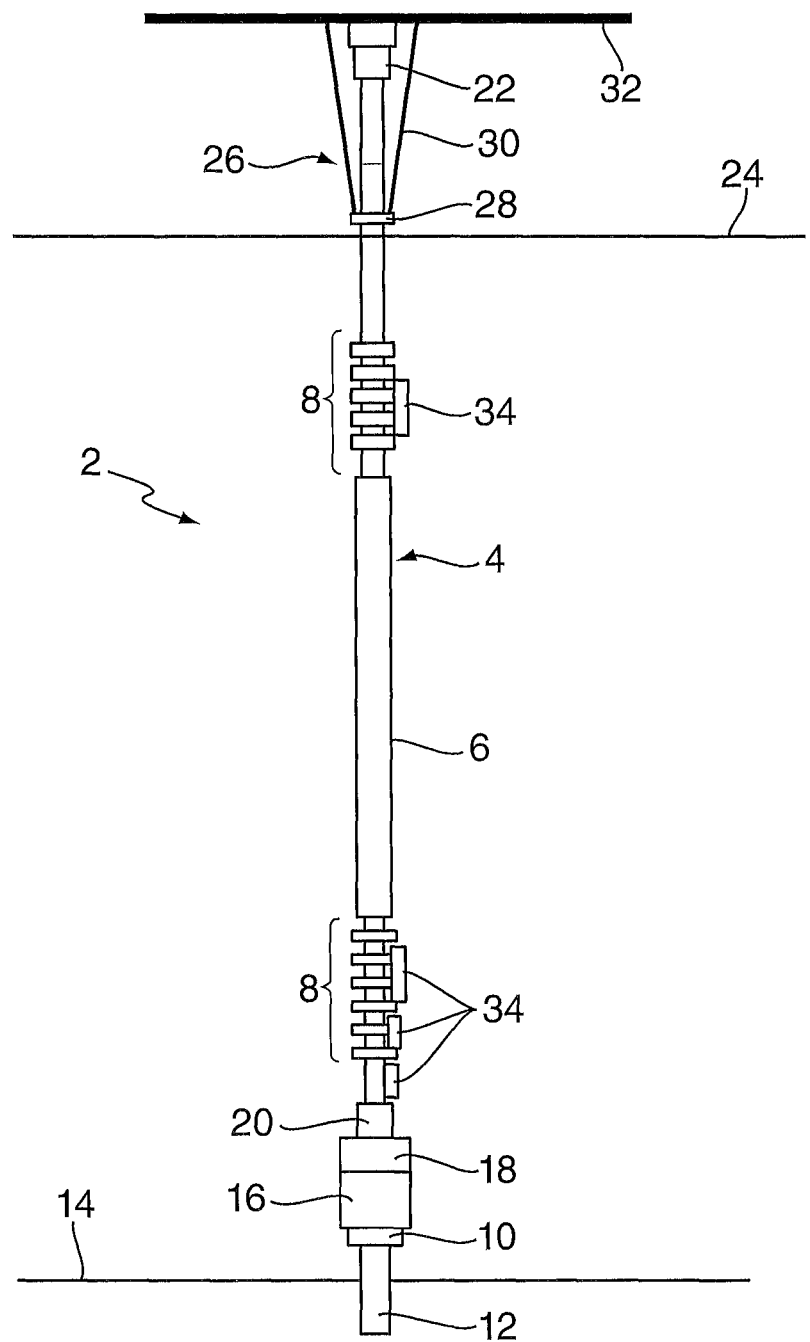
FIG. 1 is a schematic diagram of a riser fatigue monitoring system according to a preferred embodiment of the invention, having a plurality of motion modules comprising motion sensors spaced apart along the length of the riser each of which measure one or more accelerations at a single location.

As shown in FIG. 1, the present invention provides a flexible installation scheme for continuous determination of riser fatigue at any location. Motion modules are attached to the outside of a riser structure to monitor the motions of the riser at the attached locations. The motion modules can be placed at any location of concern on the riser, usually at expected hot spots in fatigue damage. The motion modules can be installed on any type of risers or similar structures, including but not limited to, drilling risers, production risers and hybrid risers. The riser configuration can be vertical riser, steel catenary riser, lazy-wave catenary riser and so forth. Similar structures include cables, umbilicals, mooring lines and pipeline spans.

FIG. 1 shows a preferred embodiment of a riser fatigue monitoring system applied to a drilling riser 2. The drilling riser 2 is typically used in deep water drilling operations. In this example, the drilling riser 2 comprises a riser string 4 including a plurality of riser pipe sections or joints. The riser string 4 will typically comprise both slick joints and buoyant joints. In the preferred embodiment illustrated in FIG. 1 a central section 6 of the riser string 4 comprises buoyant joints and upper and lower sections 8 of the riser string 4, above and below the central section 6, comprise alternating slick and buoyant joints.

The riser string 4 is connected at its lower end to a wellhead 10 and a conductor 12 located proximate the seabed 14. Above the wellhead 10 a blow out preventer (BOP) 16 and a lower marine riser package (LMRP) 18 connect to a lower flex-joint 20 of the riser string 4. The lower flex-joint 20 is used to absorb relative rotations between the LMRP 18 and the riser string 4. The riser string 4 extends upwards from the lower flex-joint 20 to an upper flex-joint 22 at the upper end of the riser string 4 above the water's surface 24. To maintain the stability of the riser string, a riser tensioner 26 is used to provide a tensile force to the riser string 4. The tensioner system 26 comprises a tension ring 28 that is attached to the riser string 4 and tensioners or tensioning cables 30 which are connected between the tension ring 28 and a drill floor 32.

In this example, motion modules 34, forming part of the fatigue monitoring system, are located on the outside of the riser string 4 in the upper and lower sections 8. The motion modules 34 comprises at least one motion sensor and may also comprise a motion logger. The motion sensor preferably comprises one or more accelerometers, and is preferably arranged to sense motion in three orthogonal directions. The motion logger is preferably arranged to store the detected motions in a memory. It will be appreciated that, in other embodiments, the motion modules may be provided at any suitable locations along the length of the riser string 4. Furthermore, any number of motion modules may be provided at any desired spatial intervals along the riser string 4.

In the present invention, the motion modules can be either standalone, battery powered or hard wired. Communication with a remote processor can be either through cables, wireless including but not limited to acoustic transmission, or data may be retrieved using Remotely Operated underwater Vehicles (ROVs).

The remote processor is arranged to receive data from one or more motion modules and to process a received acceleration time trace to obtain as acceleration spectra. A transfer function is applied to the acceleration spectra to obtain a first curvature spectra; and to process said first curvature spectra to obtain a curvature timetrace as described below.

In alternative embodiments data processing may be performed by a processor within the measurement module before sending to a remote system for further analysis.

An advantage of the invention is that the motion modules are independent from each other with no requirement for common wire to connect all modules for signal synchronization. This provides improved efficiency in riser joint installation, maintenance and/or retrieval in terms of saved time and reduced interference.

Figure 2:
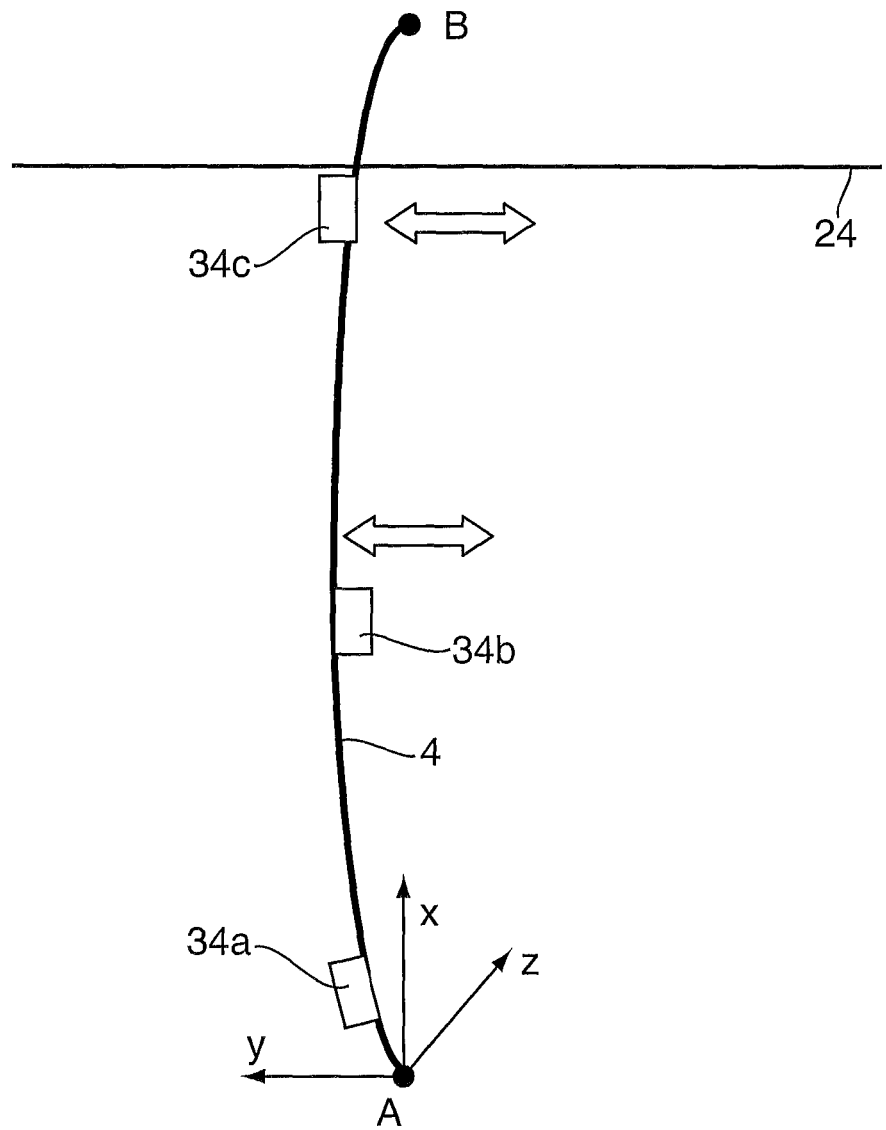
FIG. 2 is an illustration to explain the theory of converting riser motions to riser curvature along length.

Referring now to FIG. 2, the input motion can be the vessel induced motion, or wave, current and/or vortex induced motion at any locations along the riser length. The boundary condition as an example herein assumes the riser is attached to a floater at the top hang-off location and latched to the seabed or subsea structure at the bottom. For different tension providers and floating units, the boundary condition at point B should be assessed accordingly, and this invention still applies.

FIG. 2 is a schematic illustration of the curvature of a riser string 4 due to forces acting on the string. In this example, with no curvature of the riser string 4, the string extends between a lower end at A and an upper end at B along an axial direction x. Also illustrated in FIG. 2 are lateral directions y and z which are perpendicular to the axial direction x and to each other. The axial direction x refers to pipe axial direction at that location, and the lateral directions y and z are perpendicular to the local pipe axial direction.

In this example three motion modules 34 are shown. A first, lowermost module 34a is located proximate the lower end A of the riser string 4. A second, uppermost module 34c is located proximate the upper end of the riser string, but below the surface 24 of the water. A third module 34b is located approximately midway between the first and second module 34a, 34c, in the central section 6 of the string 4.

Any movement of the top end (point B) of the riser string 4, together with any lateral movement or deflections of the riser string 4 along its length, will cause a change in profile of the riser string 4 and, in particular, will induce curvature along the length of the string 4.

The motion measured by a motion module is attenuated in amplitude under various damping and inertia effects and frequency dispersion occurs.

The motion sensors are able to measure accelerations in X, Y and Z directions. As an example in the near vertical application in FIG. 2, the lateral acceleration $$\frac{\partial^2 y(L,t)}{\partial t^2} \text{ and/or } \frac{\partial^2 z(L,t)}{\partial t^2}$$

is measured by the motion sensors. The axial motion $$\frac{\partial^2 x(L,t)}{\partial t^2}$$

is also measured but is not required in the present invention.

This invention also applies to steel catenary riser (SCR) or lazy-wave SCR, which are not illustrated in FIG. 2. The motions in the lateral directions (Y and Z) are perpendicular to the pipe axis (X).

In this specification the symbol y(L,t) refers to displacement of the riser in the y direction at a location with an arc length (or curvilinear length) of L along the riser and at time instant t. Similarly, z(L,t) denotes the riser displacement in the z direction at curvilinear length L and time t. For the near vertical application in FIG. 2, the difference between the curvilinear length L and coordinate x is negligible, and y(x,t) is used instead of y(L,t) merely for notation convenience. Likewise, z(x,t) is adopted in lieu of z(L,t). Furthermore, the y(x,t) or y and z(x,t) or z are interchangeable in all following equations.

In this invention, the motion modules can be used for both as-built risers and new risers. To monitor the fatigue life of as-built risers, the motion modules can be clipped on the outer surface of the riser with help of remotely operated underwater vehicle (ROV) for deep water risers or divers for shallow water risers.

The invention distinguishes itself from those methods that utilize Finite Element Analysis (FEA) models. It is not necessary to create a riser model in the invention, nor assume any damping coefficients, as opposed to those models where prior riser configurations should be modelled for FEA software, and waves, current profiles, damping coefficients and energy attenuation along the riser have to be predetermined subjectively based on Metocean data and other sources. The method of the present invention only assesses the measured data and true riser responses with unknown damping and attenuation effects, as well as travelling history of the stress signals under real-world environmental conditions.

This invention employs an analytical method without any FEA model that has to be meshed for elements. The analytical method considers the riser string as a beam and anything attached to the beam, such as buoyant modules, is modelled as added mass or external loads. An unknown variable in the method is the mass due to "added mass". Added mass represents the mass of the surrounding water that must be moved under lateral motion. The added mass coefficients to use are determined from field tests or lab experiments. Alternatively, it can be calibrated in the field if direct strain measurements are also available.

For an ordinary Euler-Bernoulli beam, the bending stiffness El (where E is the Young's modulus and l is the second moment of area of the beam's cross section) and mass are key parameters for beam responses, while the beam in this invention refers to a modified beam with additional considerations for axial tension, shear stiffness, rotational inertia and cross-section shape, which is termed as tensioned Timoshenko beam (TTB). The TTB method includes the features of an ordinary beam and a vibrating cable (or string) and their coupled effect. When the shear modulus, G, becomes infinite and the tension and rotational inertia are neglected, the TTB is degraded to an Euler-Bernoulli beam. Likewise, if the bending stiffness El is negligible, the TTB is degenerated to a cable or string. With all parameters of TTB in play and non-trivial, TTB method simulates the coupled effects of bending, shear, rotational and tensile responses.

In addition to Euler-Bernoulli beam, the TTB method applies to short beams and composite beams, especially for beams subject to high-frequency excitations. It differs from the Euler-Bernoulli beam by taking into account shear deformation, rotational inertia effects and the tension of a riser.

The TTB method is a theory for converting accelerations to curvature. For prior art methods relying on a detailed riser configuration and FEA software, a riser has to be modelled again even if only the water depth is changed. For the TTB method, only the riser properties (tension, mass and sectional properties) at the measurement locations are required as defined below. The riser can be any length and the TTB method still applies.

The TTB method is expressed in the following equation:

$$\frac{\partial^2}{\partial x^2}\left(EI\frac{\partial^2 y}{\partial x^2}\right) + m\frac{\partial^2 y}{\partial t^2} - \frac{\partial^2}{\partial x^2}\left[\left(J + \frac{EIm}{kAG}\right)\frac{\partial^2 y}{\partial t^2}\right] + \frac{Jm}{kAG}\frac{\partial^4 y}{\partial t^4} - \frac{\partial}{\partial x}\left(S\frac{\partial y}{\partial x}\right) + f(\eta) = q(x,t) + \frac{J}{kAG}\frac{\partial^2 q}{\partial t^2} - \frac{\partial^2}{\partial x^2}\left(\frac{qEI}{kAG}\right) \qquad \text{Eq. 1}$$

where:
t is time, measured in sec
y is lateral displacement, measured in m
m is mass per unit length of riser, including added mass and internal fluid, if any measured in kg/m
E is Young's modulus of riser material measured in Pa
G is shear modulus of the riser cross section measured in Pa
A is cross-section area of the riser measured in $m^2$
l is second moment of the riser cross section area measured in $m^4$
k is shear reduction factor of riser cross section, a function of Poisson's ratio $$J = \frac{mI}{A}$$

is rotational inertia
q(x,t) is lateral force per unit riser length
S is axial tension
damping force f(η) in the form of viscous damping can be expressed as $$f(\eta) = \frac{J\eta(x)}{kAG}\frac{\partial^3 y}{\partial t^3} - \frac{\partial^2}{\partial x^2}\left[\frac{EI}{kAG}\eta(x)\frac{\partial y}{\partial t}\right] + \eta(x)\frac{\partial y}{\partial t} \qquad \text{Eq. 2}$$

where η(x) is the proportional constant determined from riser configuration. The TTB equation Eq. 1 can be solved in the frequency domain or by using differential methods in the time domain.

When an explicit analytical form is unavailable as in circumstance of complicated riser profiles and boundary conditions, a differential method is preferred.

In real-world environmental conditions, analytical expressions for local current profiles q and for damping force f are usually unavailable. Validation with measured data shows that the hydrodynamic effect of current profiles and damping forces are equivalent to that of extra added mass. Therefore, in the following analytical expressions and solutions, the damping force f is excluded.

When the axial tension S=0, the TTB simplifies to a conventional Timoshenko beam ie $$\frac{\partial^2}{\partial x^2}\left(EI\frac{\partial^2 y}{\partial x^2}\right) + m\frac{\partial^2 y}{\partial t^2} - \frac{\partial^2}{\partial x^2}\left[\left(J + \frac{EIm}{kAG}\right)\frac{\partial^2 y}{\partial t^2}\right] + \frac{Jm}{kAG}\frac{\partial^4 y}{\partial t^4} = q(x,t) + \frac{J}{kAG}\frac{\partial^2 q}{\partial t^2} - \frac{EI}{kAG}\frac{\partial^2 q}{\partial x^2} \qquad \text{Eq. 3}$$

If axial tension S=0, rotational inertia J=0 and the shear modulus of the riser pipe material G becomes very large tending towards infinity, the TTB is further degenerated to an Euler-Bernoulli beam as follows:

$$\frac{\partial^2}{\partial x^2}\left(EI\frac{\partial^2 y}{\partial x^2}\right) + m\frac{\partial^2 y}{\partial t^2} = q(x,t) \qquad \text{Eq. 4}$$

When axial tension S≠0, bending stiffness EI=0 and rotational inertia J=0 and shear modulus of the riser pipe material G becomes very large tending towards infinity, the TTB describes the behaviour of a vibrating string or cable:

$$m\frac{\partial^2 y}{\partial t^2} = S\frac{\partial^2 y}{\partial x^2} \qquad \text{Eq. 5}$$

For near vertical risers such as drilling risers, the tension S can be expressed as the weight of the riser plus the base tension $S_0$, or $$S(x,t) = S_0(x,t) + \int_0^x mg\,dx \qquad \text{Eq.6}$$

For risers with large static or dynamic curvature, such as catenary risers or jumpers, the tension S can be modified as $$S(x,t) = N(x,t) + \frac{EA}{2x}\int_0^x \left(\frac{\partial y}{\partial x}\right)^2 dx \qquad \text{Eq. 7}$$

Where N(x,t) is the axial tension and x is the riser length in concern. The equation above leads to a nonlinear Timoshenko beam equation due to the term $$\left(\frac{\partial y}{\partial x}\right)^2.$$

It is found that the use of time-averaged curvature can simplify the nonlinear equation to a linear equation with adequate accuracy.

Without loss of generality and to avoid enumerating all the solutions for all the boundary conditions and initial conditions, a solution in frequency domain for risers with negligible variations in geometric properties (ie Young's modulus E, the second moment of the riser cross section area I, cross-section area of the riser pipes A and the shear modulus of the riser pipe material G remain substantially constant) is demonstrated as an example for drilling risers, then the Eq. 1 can be simplified as $$EI\frac{\partial^4 y}{\partial x^4} + m\frac{\partial^2 y}{\partial t^2} - \left(J + \frac{EIm}{kAG}\right)\frac{\partial^4 y}{\partial x^2 \partial t^2} + \frac{Jm}{kAG}\frac{\partial^4 y}{\partial t^4} - S\frac{\partial^2 y}{\partial x^2} = q(x,t) + \frac{J}{kAG}\frac{\partial^4 q}{\partial t^4} - \frac{EI}{kAG}\frac{\partial^2 q}{\partial x^2}$$

Eq. 8

As an alternative to numerical solutions, Eq. 1 can be solved by the superposition of a general solution with lateral force per riser unit length q=0 and specific solutions for non-trivial q. The general solution is the one for the equation:

$$EI\frac{\partial^4 y}{\partial x^4} + m\frac{\partial^2 y}{\partial t^2} - \left(J + \frac{EIm}{kAG}\right)\frac{\partial^4 y}{\partial x^2 \partial t^2} + \frac{Jm}{kAG}\frac{\partial^4 y}{\partial t^4} - S\frac{\partial^2 y}{\partial x^2} = 0$$

Eq. 9

It can be solved by separation of variables:

$$y = Y(x)T(t) \text{ where } Y(x) = e^{i\lambda x}, T(t) = e^{-i\omega t}$$

Eq. 10

The corresponding Eigen equation is $$\lambda^4 + \beta\lambda^2 + \gamma = 0$$

Eq. 11 where $$\beta = \frac{S}{2EI\omega^2} - \frac{m}{2EA}\left(1 + \frac{E}{kG}\right) \text{ and } \gamma = \frac{m}{4EI}\left(\frac{mI}{kA^2G} - \frac{1}{\omega^2}\right)$$

The four roots of $\lambda$ are determined by substituting $$\gamma = \frac{m}{4EI}\left(\frac{mI}{kA^2G} - \frac{1}{\omega^2}\right)$$

and $\beta$ into Eq. 11.

$$\lambda^2 = \omega^2\left[-\beta + \sqrt{\beta^2 - \frac{m}{EI}\left(\frac{mI}{kA^2G} - \frac{1}{\omega^2}\right)}\right]$$

Eq. 12

For angular frequency $\omega$ in rad/s and remembering that $$J = \frac{mI}{A},$$

If $$\omega \leq \sqrt{\frac{GkA}{J}},$$

the solution is $$y(x,t) = (P_1 \cos h\lambda_1 x + P_2 \sin h\lambda_2 x + P_3 \cos \lambda_3 x + P_4 \sin \lambda_4 x)e^{-i\omega t}$$

Eq. 13

For $$\omega > \sqrt{\frac{GkA}{J}},$$

the solution becomes $$y(x,t) = (P_1 \cos \lambda_1 x + P_2 \sin \lambda_2 x + P_3 \cos \lambda_3 x + P_4 \sin \lambda_4 x)e^{-i\omega t}$$

Eq. 14

The 4 constants of P ($P_1$ to $P_4$) are determined by initial and boundary conditions. For instance, for drilling risers with an upper and lower flexjoint, the corresponding general solution between these two points in the riser system is $$y = p \sin \lambda x e^{-i\omega t}$$

Eq. 15

Denoting $$Y(\omega) = p \sin \lambda x$$

Eq. 16 the sum of the response from all frequencies is $$y(x,t) = \sum_\omega Y(\omega)e^{-i\omega t}$$

Eq. 17 or $$y(x,t) = \text{IFFT}[Y(\omega)]$$

Eq. 18 and hence $$Y(\omega) = \text{FFT}(y(x,t))$$

Eq. 19

The acceleration is $$a(x,t) = \frac{\partial^2 y(x,t)}{\partial t^2} = -\omega^2 y(x,t)$$

Eq. 20 or in frequency domain $$a(\omega) = \frac{\partial^2 y(x,t)}{\partial t^2} = -\omega^2 Y(\omega).$$

Eq. 21

The curvature $\chi$ in the time domain is obtained from Eq. 16:

$$\chi(x,t) \approx \frac{\partial^2 y(x,t)}{\partial x^2} = -\lambda^2 y(x,t)$$

Eq. 22 or in frequency domain $$\chi(\omega) = \lambda^2 Y(\omega)$$

Eq. 23

The relation between acceleration and curvature becomes $$\chi(\omega) = \frac{\lambda^2}{\omega^2} a(\omega)$$

Eq. 24

The transfer function from acceleration to curvature in frequency domain is $$c(\omega) \equiv \frac{\lambda^2}{\omega^2} = -\beta + \sqrt{\beta^2 - \frac{m}{EI}\left(\frac{mI}{kA^2G} - \frac{1}{\omega^2}\right)}$$

Eq. 25

Compared with Eq. 9, the plus sign is adopted for the square root in the transfer function of the aforementioned drilling riser example whose boundary conditions give the general solution of Eq.12. For other riser types or boundary conditions, the transfer function can be derived accordingly. The general solution remains in the form of Eq.10 and Eq.11, The 4 roots of A are determined by Eq.9. Different boundary conditions entail different 4 constants of P ($P_1$ to $P_4$) for corresponding roots of A, With the use of Eq. 21, the curvature in the frequency domain in Eq. 20 becomes:

$$\chi(\omega)=c(\omega)a(\omega) \qquad \text{Eq. 26}$$

The curvature time trace is calculated using an Inverse Fast Fourier Transform (IFFT) as follows:

$$\chi(x,t)=\text{IFFT}(c(\omega)a(\omega)) \qquad \text{Eq. 27}$$

Substituting Eq. 26 into Eq. 27, one obtains:

$$\chi(x,t)=\text{IFFT}(c(\omega)a(\omega)) \qquad \text{Eq. 28}$$

which is $$\chi(x,t) = IFFT\left\{\left[-\beta + \sqrt{\beta^2 - \frac{m}{EI}\left(\frac{mI}{kA^2G} - \frac{1}{\omega^2}\right)}\right] \cdot * FFT[a(t)]\right\} \qquad \text{Eq. 29}$$

The ".*" symbol in the equation denotes multiplication of the two series in the frequency domain item by item for each frequency.

The specific solutions for non-trivial q depend on applications. Most FEA software assumes the current profile remains constant with time t, and the specific solutions can be obtained analytically. However, field measurements indicate that, current speed varies with time, depth and orientation. In practice, current profiles in real time are not available, thus analytical specific solutions are groundless. Fortunately, validation with field measurements from strain sensor data shows that the uncertainty in fluid dynamics due to varying current and other lateral loading and damping is in the same magnitude of the uncertainty in added mass, which is determined by an added mass coefficient and an inertia outer diameter. Therefore, the effect of unknown current q can be accounted for in terms of added mass in the general solution, and the specific solutions become dispensable.

With the curvature calculated from the accelerations, the stress time trace is $$\sigma(x,t) = \chi(x,t)E\frac{D}{2} \qquad \text{Eq. 30}$$

where D is the outer diameter of the riser at the motion module location, and E is the Young's modulus of the steel pipe, Fatigue life can be calculated in many ways. For example, the Rain Flow stress cycle counting approach may be used to obtain number of stress cycles n and stress ranges $\Delta\sigma$, then use an S-N curve to obtain damage. A typical S-N curve gives $$N=a(\text{SCF}*\Delta\sigma)^{-k} \qquad \text{Eq. 31}$$

where N is the number of cycles to failure, a and k are S-N curve intercept and slope parameters, SCF is stress concentration factor. There might be other factors, for example, thickness correction factor for thick-walled pipe. The fatigue damage for each stress range is n/N. The total damage can be calculated using Miner's rule. Fatigue life is reciprocal of the total damage factored by a year.

Figure 3:
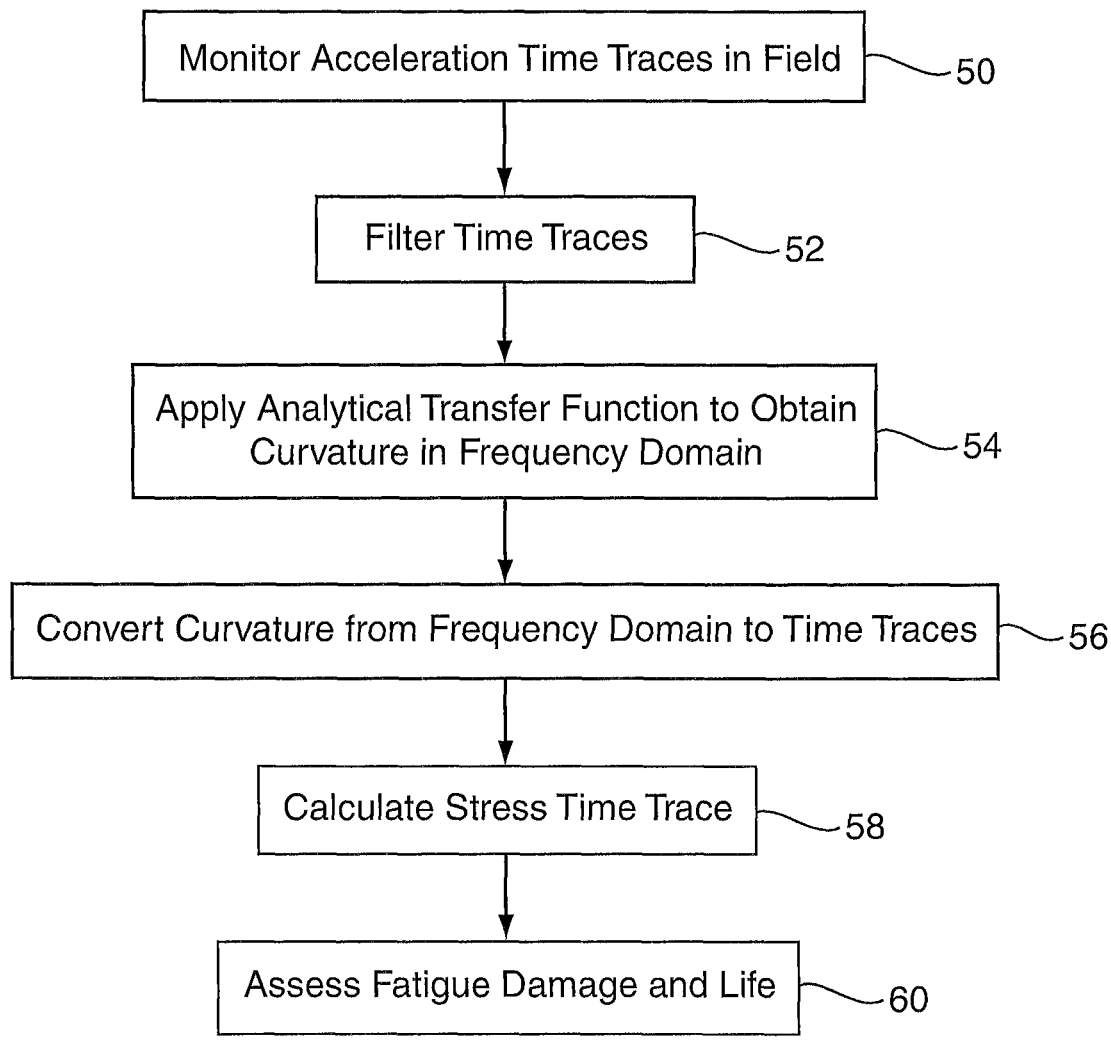
FIG. 3 is a flowchart of the steps in a method of determining riser fatigue according to a preferred embodiment of the invention.

FIG. 3 is a flow chart that illustrates the primary steps in a method of monitoring riser fatigue according to a preferred embodiment of the invention.

At a first step 50 acceleration data, preferably in the form of acceleration time traces, is acquired by the motion modules attached to the riser string. Depending on the sampling frequency and monitoring equipment hardware, the measured acceleration time traces may include data at frequencies that are not of interest for use in the method of the present invention. Accordingly, at a second step 52, the measurements are filtered to remove any unwanted frequency ranges. The measurements may be filtered using a suitable band pass filter.

The filter acceleration data is then converted into the frequency domain using a Fast Fourier Transform (FFT) to obtain an acceleration spectrum, at a third step 54. To obtain a curvature spectrum, the acceleration spectrum is then multiplied by a transfer function as shown in Eq. 25

It will be appreciated by those skilled in the art that filtering step 52 may be performed either before or after conversion step 54.

At a fourth step 56 the curvature spectrum is converted into a curvature time trace using an inverse FFT (IFFT) as shown in Eq. 29.

At a fifth step 58 the curvature time trace is used to calculate a stress time trace, Eq. 30.

Finally, at a sixth step 60, the stress time trace is post-processed to determine fatigue damage and life.

A common approach to determine fatigue damage is rainflow stress cycle counting followed by fatigue calculation using the stress/number of cycles approach as described above.

The invention claimed is:

1. A method for determining curvature at a vertical position in a subsea riser system comprising the steps of:
periodically measuring acceleration in a first lateral direction at said vertical position using a motion sensor connected to the subsea riser to obtain a first acceleration timetrace;
processing said first acceleration timetrace using a processor to obtain a first acceleration spectra of the subsea riser;
applying a transfer function to said first acceleration spectra using the processor to obtain a first curvature spectra of the subsea riser, wherein the transfer function is determined by a method comprising the step of modelling the riser as a Tensioned Timoshenko Beam;
processing said first curvature spectra using the processor to obtain a first curvature timetrace at the vertical position of the subsea riser; and
analyzing the first curvature timetrace using the processor to produce a first stress timetrace at the vertical position of the subsea riser.

2. The method of claim 1, in which the Tensioned Timoshenko Beam equation is defined as:

$$\frac{\partial^2}{\partial x^2}\left(EI\frac{\partial^2 y}{\partial x^2}\right) + m\frac{\partial^2 y}{\partial t^2} - \frac{\partial^2}{\partial x^2}\left[\left(J + \frac{EIm}{kAG}\right)\frac{\partial^2 y}{\partial t^2}\right] + \frac{Jm}{kAG}\frac{\partial^4 y}{\partial t^4} - S\frac{\partial^2 y}{\partial x^2} =$$

$$q(x,t) + \frac{J}{kAG}\frac{\partial^2 q}{\partial t^2} - \frac{EI}{kAG}\frac{\partial^2 q}{\partial x^2}$$

where:
t is time
y is lateral displacement m is mass per unit length of riser
E is Young's modulus of riser material
G is shear modulus of the riser cross section
A is cross-section area of the riser
I is second moment of the riser cross section area
k is shear reduction factor of riser cross section $$J = \frac{mI}{A}$$

is rotational inertia
q(x,t) is lateral force per unit riser length
S is axial tension.

3. The method of claim 2, in which the mass includes added mass representing the mass of the surrounding water that must be moved under lateral motion.

4. The method of claim 2, in which the step of modelling the riser further comprises the step of modelling a riser having negligible variations in geometric properties.

5. The method of claim 2, in which the riser is assumed to have an upper and lower flexjoint such that:

$$y = p \sin \lambda x e^{-i\omega t}$$

where y is the lateral displacement, p is an arbitrary constant, $\lambda$ is wave number, $\omega$ is angular frequency, and t is time.

6. The method of claim 1, in which the step of determining the transfer function further comprises the step of determining initial and boundary conditions.

7. The method of claim 1 in which the transfer function is:

$$c(\omega) \equiv \frac{\lambda^2}{\omega^2} = -\beta + \sqrt{\beta^2 - \frac{m}{EI}\left(\frac{mI}{kA^2G} - \frac{1}{\omega^2}\right)}$$

where c is the transfer function, $\omega$ is circular frequency, is $\lambda$ wave number, m is riser mass plus added mass per unit length, E is Young's modulus, I is the second moment of riser cross section area, A is riser cross-section area, G is shear modulus, k is a constant, and $$\beta = \frac{S}{2EI\omega^2} - \frac{m}{2EA}\left(1 + \frac{E}{kG}\right),$$

where S is riser tension at the measurement location.

8. The method of claim 1, in which the method further comprises periodically measuring acceleration in a second lateral direction at said vertical position to obtain a second acceleration timetrace;
processing said second acceleration time trace to obtain a second acceleration spectra;
applying a transfer function to said second acceleration spectra to obtain a second curvature spectra; and
processing said second curvature spectra to obtain a second curvature timetrace.

9. The method of claim 1, in which the second lateral direction is substantially perpendicular to the first lateral direction.

10. The method of claim 1, in which the step of analyzing the first curvature timetrace to produce a first stress timetrace is performed using the equation:

$$\sigma(x, t) = \chi(x, t) E \frac{D}{2}$$

where $\sigma$ is stress range time trace, x is the location of the measurement, t is time, E is Young's modulus, and D is riser structural outer diameter.

11. The method of claim 1, in which the method further comprises the step of processing the first stress timetrace to determine fatigue.

12. A subsea riser system comprising:
a motion sensor connected to a subsea riser and configured to periodically measure acceleration of the subsea riser in a first lateral direction at a first vertical position to obtain a first acceleration timetrace;
communication means for sending said first acceleration timetrace to a processor;
in which the processor is configured to:
process said first acceleration time trace to obtain a first acceleration spectra of the subsea riser;
apply a transfer function to said first acceleration spectra to obtain a first curvature spectra of the subsea riser, wherein the transfer function is determined by a method comprising the step of modelling the riser as a Tensioned Timoshenko Beam;
process said first curvature spectra to obtain a first curvature timetrace at the vertical position of the subsea riser; and
analyze the first curvature timetrace to produce a first stress timetrace at the vertical position of the subsea riser.

* * * * *